(12) United States Patent
Wu et al.

(10) Patent No.: US 6,417,065 B1
(45) Date of Patent: Jul. 9, 2002

(54) METHOD OF FABRICATING A BOTTOM ELECTRODE

(75) Inventors: King-Lung Wu, Tainan Hsien; Kun-Chi Lin, Hsinchu, both of (TW)

(73) Assignee: United Microelectronics Corp., Hsinchu (TW)

(*) Notice: Subject to any disclaimer, the term of this patent is extended or adjusted under 35 U.S.C. 154(b) by 51 days.

(21) Appl. No.: 09/718,190

(22) Filed: Nov. 20, 2000

(51) Int. Cl.[7] .................. H01L 21/8242; H01L 21/20; H01L 21/3205
(52) U.S. Cl. .................. 438/396; 438/253; 438/595
(58) Field of Search .................. 438/239, 240, 438/241, 242, 243–256, 393, 394–398, 595

(56) References Cited

U.S. PATENT DOCUMENTS

| | | | | |
|---|---|---|---|---|
| 5,380,675 A | * | 1/1995 | Hsue et al. | 438/396 |
| 5,798,289 A | * | 8/1998 | Ajika et al. | 438/239 |
| 5,801,079 A | * | 9/1998 | Takaishi | 438/396 |
| 5,811,332 A | * | 9/1998 | Chao | 438/253 |
| 6,268,246 B1 | * | 7/2001 | Ukita et al. | 438/253 |
| 6,271,099 B1 | * | 8/2001 | Lou | 438/396 |
| 6,274,423 B1 | * | 8/2001 | Prall et al. | 438/239 |
| 6,274,427 B1 | * | 8/2001 | Iwasaki | 438/253 |
| 6,277,688 B1 | * | 8/2001 | Tseng | 438/255 |
| 6,281,070 B1 | * | 8/2001 | Lane et al. | 438/253 |
| 6,281,073 B1 | * | 8/2001 | Lee | 438/255 |
| 6,333,240 B1 | * | 12/2001 | Durcan et al. | 438/396 |
| 6,335,237 B1 | * | 1/2002 | Tang et al. | 438/238 |

FOREIGN PATENT DOCUMENTS

| JP | 406120449 A | * | 4/1994 |
|---|---|---|---|
| JP | 406125052 A | * | 5/1994 |
| JP | 406163848 A | * | 6/1994 |
| JP | 406188365 A | * | 7/1994 |
| JP | 406196649 A | * | 7/1994 |
| JP | 406216336 A | * | 8/1994 |
| JP | 406216339 A | * | 8/1994 |

* cited by examiner

*Primary Examiner*—Matthew Smith
*Assistant Examiner*—Chuong Anh Luu
(74) *Attorney, Agent, or Firm*—Charles C. H. Wu; Wu & Cheung, LLP

(57) ABSTRACT

A method of fabricating a bottom electrode is described. A substrate having a conductive layer therein is provided. A first dielectric layer is formed over the substrate. A conductive plug is formed through the first dielectric layer to electrically couple with the conductive layer. A cap layer is formed over the substrate to cover the conductive plug. An isolation layer is formed over the cap layer. A plurality of bit lines is formed over the isolation layer. A second dielectric layer is formed over the isolation layer. A node contact opening is formed through the second dielectric layer, the bit lines and the isolation layer to expose the cap layer. A conformal isolation layer is formed over the substrate to partially fill the contact node opening. A third dielectric layer having an opening is formed over the substrate. The opening is aligned with the node contact opening. An etching step is performed to remove a portion of the conformal isolation layer exposed by the opening and the cap layer. An isolation spacer remaining from the conformal isolation layer is formed on a sidewall of the contact node opening. A conformal conductive layer is formed in the opening and the node contact opening to make contact with the conductive plug. The third dielectric layer is removed.

20 Claims, 5 Drawing Sheets

METHOD OF FABRICATING A BOTTOM ELECTRODE

BACKGROUND OF THE INVENTION

1. Field of the Invention

The present invention relates to a semiconductor fabrication method. More particularly, the present invention relates to a method of fabricating a bottom electrode.

2. Description of the Related Art

As the integration of the semiconductor devices increases and the linewidth thereof decreases, it becomes desirable to form more semiconductor devices in a very limited area. Due to limitations imposed by the fabrication process, it is difficult to achieve a highly integrated circuit. In addition, because difficulties exist in forming a highly integrated device, it is hard to ensure the reliability of the device. Therefore, how to fabricate highly integrated semiconductor devices has became the main topic of the recent research on semiconductor fabrication at the 0.13 micron level.

FIG. 1 is a schematic, cross-sectional view illustrating a conventional method of forming a bit line and a bottom electrode.

A metal oxide semiconductor (MOS) is formed on the substrate 100. The MOS includes a gate 102 on the substrate 100, a spacer 104 on the sidewall of the gate 102 and the source/drain region 106 in the substrate 100 beside the gate 102. A dielectric layer 108 is formed over the substrate 100 to cover the MOS. A bit line 110 is formed through the dielectric layer 108 to electrically couple with the source/drain region 106. A dielectric layer 112 is formed over the substrate 100 to cover the bit line 110. A bottom electrode 114 is formed through the dielectric layers 108 and 112 to electrically couple with the source/drain region 106.

In the conventional method, devices, such as bit line 110 and the bottom electrode 114 are separated from each other. Consequently, the integration of the semiconductor circuit cannot be effectively increased. Thus, there is a need to further increase the integration of semiconductor devices.

In addition, due to the fabrication limitation for forming semiconductor devices in a limited area, box-shaped capacitors are usually formed. However, the conventional box-shaped capacitor cannot provide sufficient capacitance. Thus, the capacitance of the conventional capacitor is limited.

SUMMARY OF THE INVENTION

The invention provides a method of fabricating a bottom electrode. A substrate having a conductive layer therein is provided. A first dielectric layer is formed over the substrate. A conductive plug is formed through the first dielectric layer to electrically couple with the conductive layer. A cap layer is formed over the substrate to cover the conductive plug. An isolation layer is formed over the cap layer. A plurality of bit lines is formed over the isolation layer. A second dielectric layer is formed over the isolation layer. A node contact opening is formed through the second dielectric layer, the bit lines and the isolation layer to expose the cap layer. A conformal isolation layer is formed over the substrate to partially fill the contact node opening. A third dielectric layer having an opening is formed over the substrate. The opening is aligned with the node contact opening. An etching step is performed to remove a portion of the conformal isolation layer exposed by the opening and the cap layer. An isolation spacer remaining from the conformal isolation layer is formed on a sidewall of the contact node opening. A conformal conductive layer is formed in the opening and the node contact opening to make contact with the conductive plug. The third dielectric layer is removed.

In contrast with the conventional method, which has the bit line and the bottom electrode far way from each other, the bit lines and the bottom electrode of the present invention are next to each other. Thus, the integration of the semiconductor devices fabricated by the present invention is effectively increased. In addition, since the isolation spacer is used to isolate the bit lines from the bottom electrode, the reliability of the devices is enhanced. Furthermore, in comparison with the box-shaped bottom electrode formed by the conventional method, the bottom electrode of the present invention has an increased surface area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
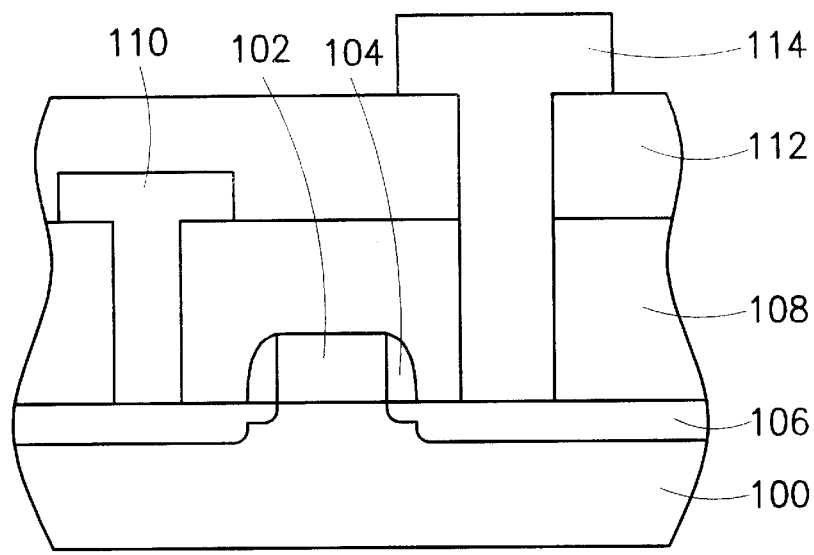
FIG. 1 is a schematic, cross-sectional view illustrating a conventional method of forming a bit line and a bottom electrode.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views illustrating a method of fabricating a bottom electrode according to one preferred embodiment of the invention.

Figure 2A:
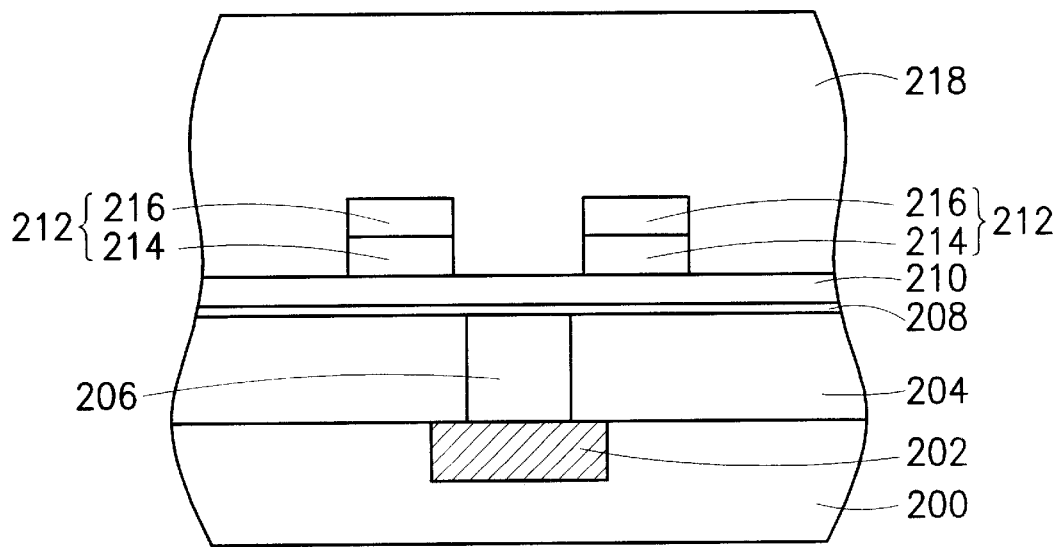
FIGS. 2A through 2F are schematic, cross-sectional views illustrating a method of fabricating a bottom electrode according to one preferred embodiment of the invention.

Referring to FIG. 2A, a substrate 200 having a conductive layer 202 therein is provided. The conductive layer 202 can be, for example, a source/drain region of a MOS or a conductive line. A dielectric layer 204 is formed over the substrate 200 by, for example, chemical vapor deposition. The dielectric layer 204 includes an oxide layer, a tetra-ethyl-ortho-silicate (TEOS) layer, a borophosphosilicate glass (BPSG) layer, or a phosphosilicate glass (PSG) layer. A conductive plug 206, such as a polysilicon plug, is formed through the dielectric layer 204 to electrically couple with the conductive layer 202. A cap layer 208, such as a silicon nitride layer, is formed over the substrate 200 to cover the conductive plug 206. The cap layer 208 preferably has a thickness of about 100 angstroms to about 500 angstroms and is formed by, for example, plasma-enhanced chemical vapor deposition or deposition in a furnace. An isolation layer 210, such as an oxide layer, is formed over the cap layer 208. The isolation layer 210 preferably has a thickness of about 1000 angstroms to about 2000 angstroms. A plurality of bit lines 212 is formed on the isolation layer 210. For example, each bit line 210 includes a polysilicon layer 214 and a tungsten silicide layer 216, as shown in the figure.

A dielectric layer 218 is formed over the substrate 200 by, for example, chemical vapor deposition. The dielectric layer 218 includes an oxide layer, a tetra-ethyl-ortho-silicate (TEOS) layer, a borophosphosilicate glass (BPSG) layer, or a phosphosilicate glass (PSG) layer. The dielectric layer 218 preferably has a thickness of about 2000 angstroms to about 3000 angstroms.

Figure 2B:
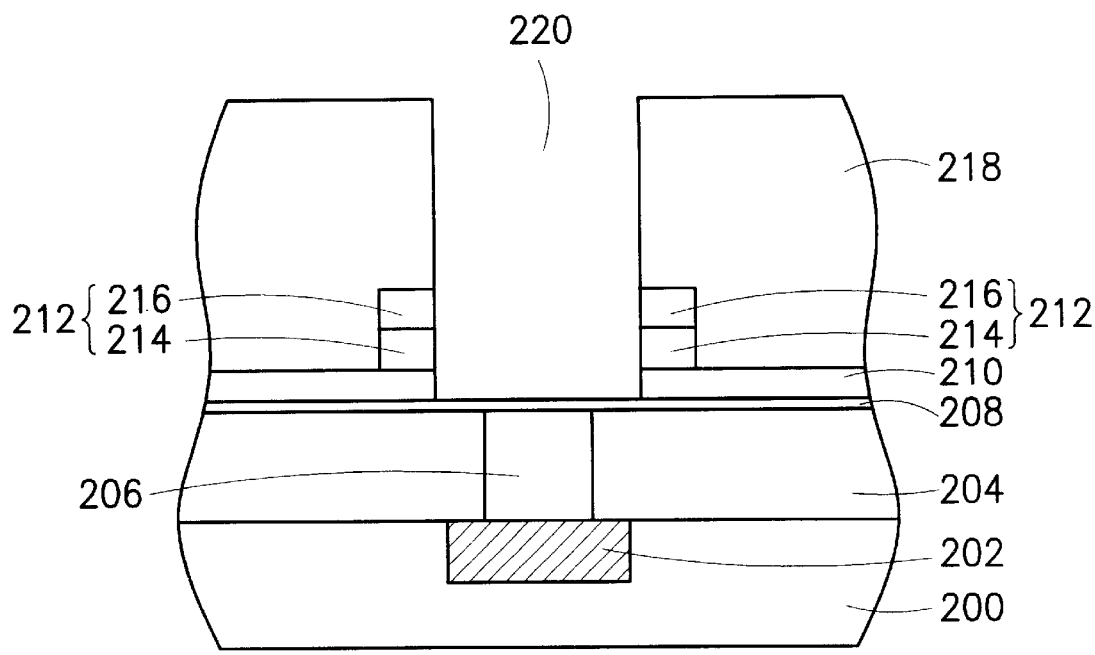

Reference is made to FIG. 2B, which shows a formation of a node contact opening 220. A photolithographic and etching step is performed. A mask layer (not shown) is formed over the dielectric layer 218. The dielectric layer 218 and the oxide layer 210 exposed by the mask layer are removed until the cap layer 208 is exposed. The dielectric layer 218 and the oxide layer 210 are removed by, for example, an etching step using the cap layer 208 as an etching stop. Thereafter, portions of bit lines 212 exposed by the mask layer are removed to leave bit lines 212a. Each bit lines 212a includes a polysilicon layer 214a and a tungsten silicide layer 216a. The portions of the bit lines 212 are removed by, for example, an etching step using the cap layer 208 as an etching stop. The node contact opening 220 having a sidewall 221 is formed. The mask layer is removed.

Figure 2C:
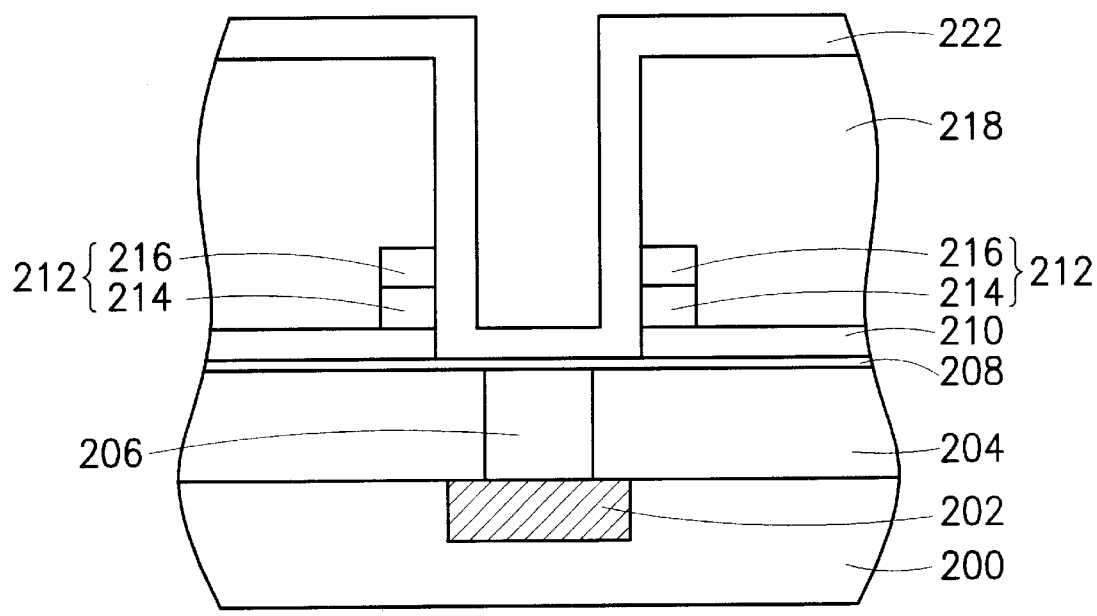

Referring to FIG. 2C, a conformal isolation layer 222 is formed over the substrate 200. The thickness of the conformal isolation layer 222 preferably is about 300 angstroms to about 500 angstroms. The etching rate of the conformal isolation layer 222 preferably is the same or about the same as the etching rate of the cap layer 208.

Figure 2D:
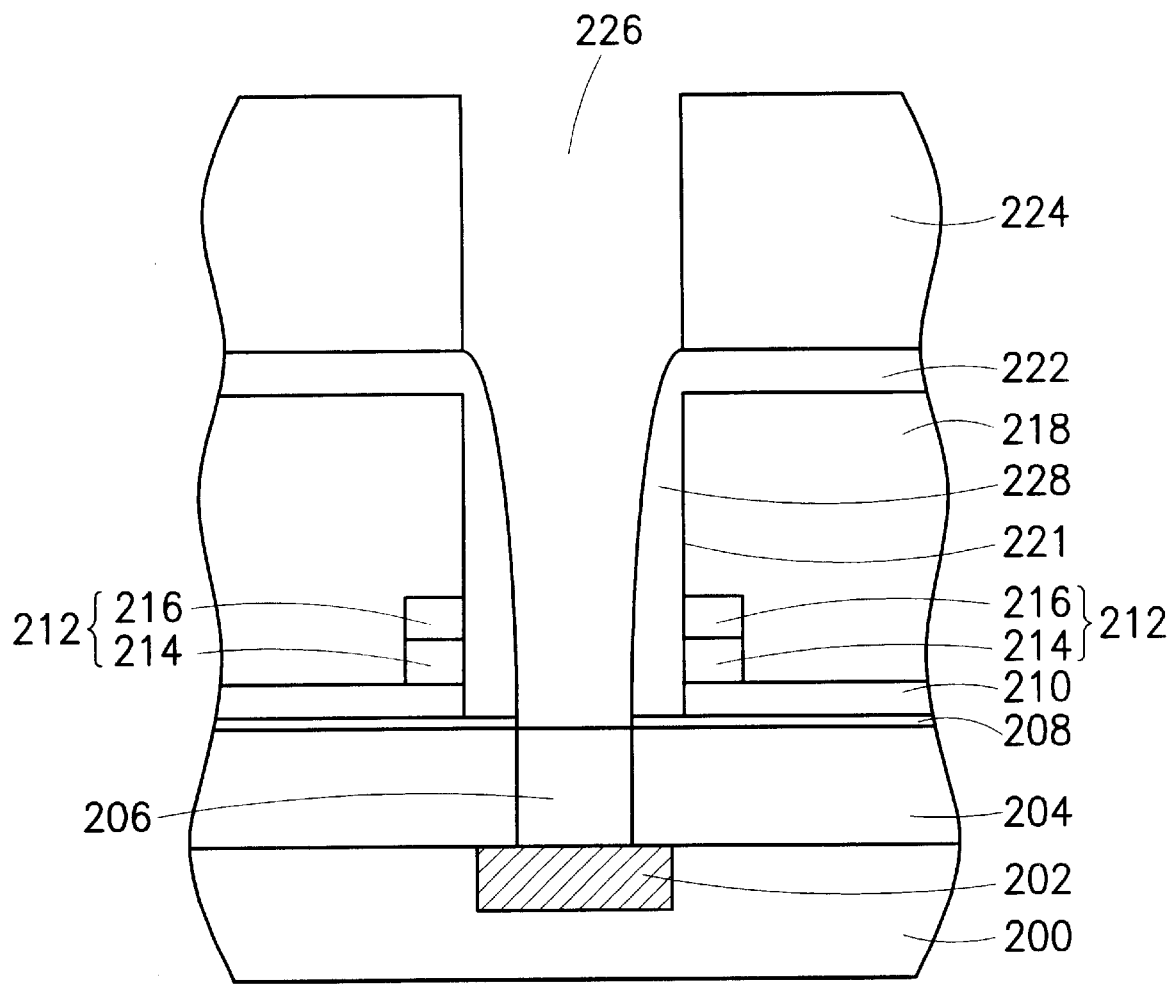

Referring to FIG. 2D, a dielectric layer 224 is formed over the substrate 200 by, for example, chemical vapor deposition. The dielectric layer 224 includes an oxide layer, a tetra-ethyl-ortho-silicate (TEOS) layer, a borophosphosilicate glass (BPSG) layer, or a phosphosilicate glass (PSG) layer. The thickness of the dielectric layer 224 is about 300 angstroms to about 600 angstroms. The dielectric layer 224 is patterned to form an opening 226 aligned with the node contact opening 220. The dielectric layer 224 is patterned by, for example, etching using the cap layer 208 as an etching stop. The opening 226 preferably has the same planar area as the node contact opening 220. Thereafter, an etching step is performed. A portion of the isolation layer 222 exposed by the opening 226 is removed to form an isolation spacer 228 on the sidewall 221 of the node contact opening 220. At the same time, the cap layer 208 exposed by the spacer 228 is removed.

Figure 2E:
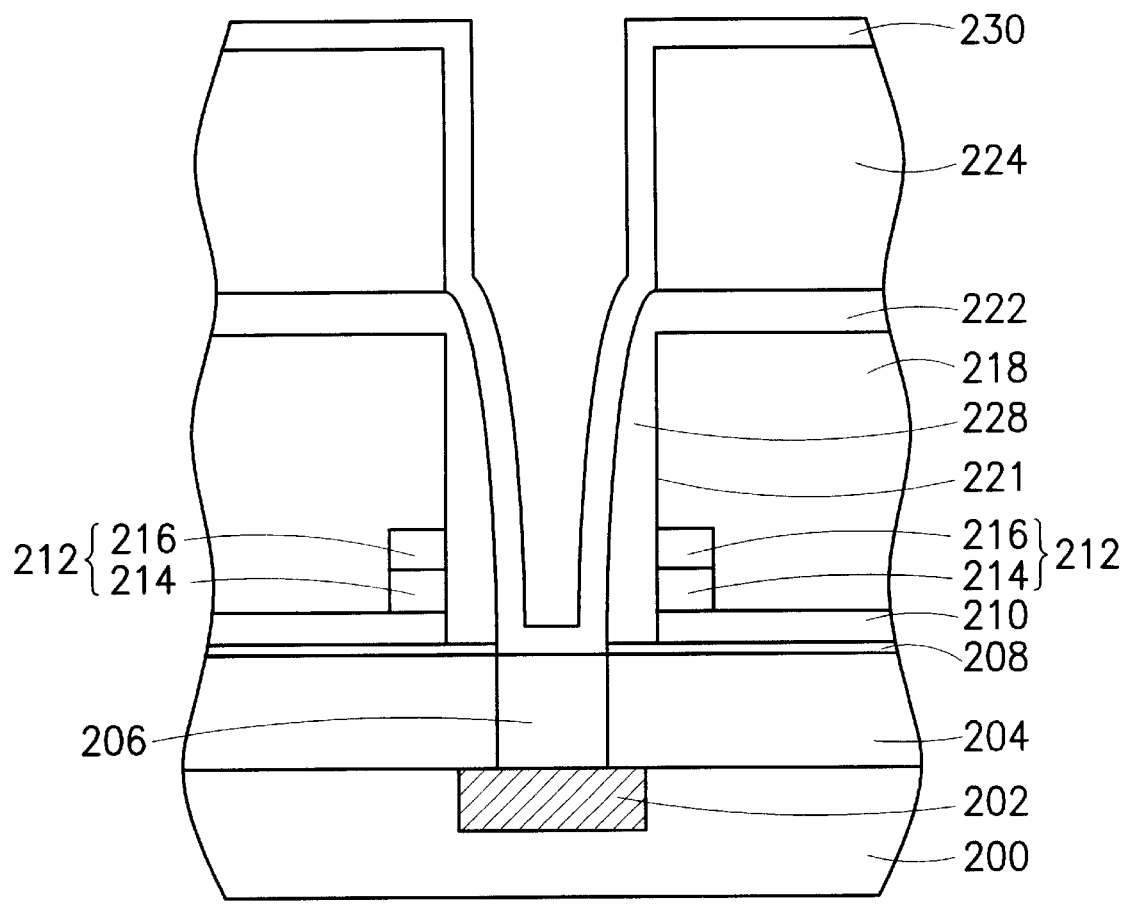

Referring to FIG. 2E, a conformal conductive layer 230 is formed over the substrate 200 to partially fill the opening 226 and the node contact opening 220 and make contact with the conductive plug 206. The conformal conductive layer 228 preferably has a thickness of about 300 angstroms to about 600 angstroms.

Figure 2F:
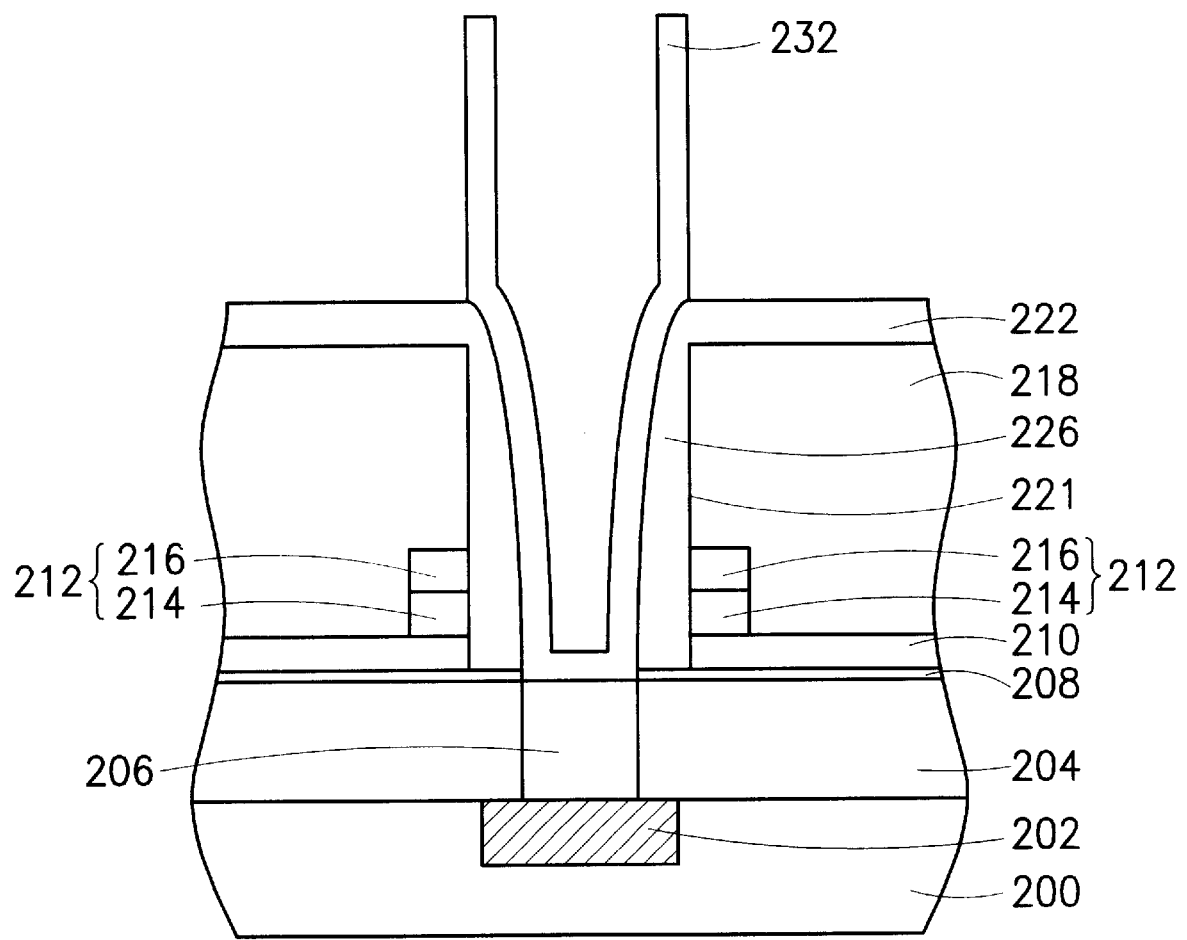

Referring to FIG. 2F, the conformal conductive layer 230 on the dielectric layer 224 is removed. For example, the conformal conductive layer 230 on the dielectric layer 224 is removed by, etching or chemical-mechanical polishing. A conformal conductive layer 232 remains from the conformal conductive layer 230. Thereafter, the dielectric layer 224 is removed to expose the isolation layer 222. The dielectric layer 224 can be removed by, for example, an etching step using the isolation layer 222 as an etching stop. A bottom electrode is formed.

The present invention increases the integration of the semiconductor circuit by forming the bottom electrode and the bit lines 212 next to each other. Thus, the integration of the semiconductor devices is effectively increased. In addition, since the isolation spacer 228 is used to isolate the bit lines 212a from the bottom electrode, the reliability of the devices is enhanced. Furthermore, in comparison with the box-shaped bottom electrode formed by the conventional method, the bottom electrode of the present invention has an increased surface area.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bottom electrode, comprising:

providing a substrate having a conductive layer therein;

forming a first dielectric layer over the substrate;

forming a conductive plug through the first dielectric layer to electrically couple with the conductive layer;

forming a cap layer over the substrate to cover the conductive plug;

forming an isolation layer over the cap layer;

forming a plurality of bit lines over the isolation layer;

forming a second dielectric layer over the isolation layer to cover the bit lines;

forming a node contact opening through the second dielectric layer, the bit lines and the first isolation layer, wherein the node contact opening is formed between the bit lines;

forming a conformal isolation layer over the substrate to partially fill the contact node opening;

forming a third dielectric layer having an opening over the substrate, wherein the opening is aligned with the node contact opening;

performing an etching step to remove a portion of the conformal isolation layer exposed by the opening to form an isolation spacer on a sidewall of the node contact opening, and remove the cap layer exposed by the isolation spacer at the same time;

forming a conformal conductive layer in the opening and the node contact opening to make contact with the conductive plug.

2. The method of claim 1, wherein forming the cap layer comprises forming a silicon nitride layer.

3. The method of claim 1, wherein the cap layer is formed by plasma-enhanced chemical vapor deposition.

4. The method of claim 1, wherein the cap layer is deposited in a furnace.

5. The method of claim 1, wherein the cap layer has a thickness of about 100 angstroms to about 500 angstroms.

6. The method of claim 1, wherein forming the isolation layer comprises forming an oxide layer.

7. The method of claim 1, wherein the thickness of the isolation layer is about 1000 angstroms to about 2000 angstroms.

8. The method of claim 1, wherein the thickness of the second dielectric layer is about 2000 angstroms to about 3000 angstroms.

9. The method of claim 1, wherein forming the node contact opening through the second dielectric layer, the bit lines, and the isolation layer further comprises:

performing a first etching step to remove the second dielectric layer and the isolation layer using the cap layer as an etching stop; and performing a second etching step to remove portions of the bit lines exposed by the second dielectric layer, wherein the cap layer serves as an etching stop.

10. The method of claim 1, wherein forming the conformal isolation layer comprises forming a silicon nitride layer.

11. The method of claim 1, wherein an etching rate of the conformal isolation layer is the same as the etching rate of the cap layer.

12. The method of claim 1, wherein an etching rate of the conformal isolation layer is about the same as the etching rate of the cap layer.

13. The method of claim 1, wherein the conformal isolation layer has a thickness of about 300 angstroms to about 500 angstroms.

14. The method of claim 1, wherein the conformal isolation layer is formed by plasma-enhanced chemical vapor deposition.

15. The method of claim 1, wherein the conformal isolation layer is formed by deposition in a furnace.

16. A method of fabricating a bottom electrode, comprising:

forming a first dielectric layer over a substrate;

forming a conductive plug through the first dielectric layer;

forming a cap layer over the substrate to cover the conductive plug;

forming an isolation layer over the cap layer;

forming a plurality of bit lines over the isolation layer;

forming a second dielectric layer over the isolation layer to cover the bit lines;

forming a node contact opening through the second dielectric layer, the bit lines and the first isolation layer, wherein the node contact opening is formed between the bit lines;

forming a third dielectric layer having an opening over the substrate, wherein the opening is aligned with the node contact opening;

forming an isolation spacer on a sidewall of the node contact opening;

removing the cap layer exposed by the isolation spacer;

forming a conductive layer in the opening and the node contact opening to make contact with the conductive plug.

17. The method of claim 16, wherein an etching rate of the cap layer is higher than etching rates of the second dielectric layer and the isolation layer.

18. The method of claim 16, wherein the cap layer has a thickness of about 100 angstroms to about 500 angstroms.

19. The method of claim 16, wherein the cap layer is formed by plasma-enhanced chemical vapor deposition.

20. The method of claim 16, wherein the cap layer is deposited in a furnace.

* * * * *